United States Patent [19]

Pape

[11] Patent Number: 4,803,554
[45] Date of Patent: Feb. 7, 1989

[54] ELECTRONIC IMAGING CAMERA UTILIZING EPROM MEMORY

[75] Inventor: David D. Pape, Framingham, Mass.

[73] Assignee: Polaroid Corporation, Cambridge, Mass.

[21] Appl. No.: 102,859

[22] Filed: Sep. 30, 1987

[51] Int. Cl.$^4$ .......................................... H04N 5/225
[52] U.S. Cl. .................................... 358/209; 358/909
[58] Field of Search .................. 358/209, 906, 909, 44

[56] References Cited

U.S. PATENT DOCUMENTS

| | | | |
|---|---|---|---|
| 4,415,937 | 11/1983 | Nishizawa et al. | 358/335 |
| 4,489,351 | 12/1984 | d'Alayer de Costemore d'Arc | 358/213 |
| 4,525,729 | 6/1985 | Agulnek et al. | 346/154 |
| 4,532,558 | 7/1985 | Oota et al. | 360/35.1 |
| 4,541,020 | 9/1985 | Kimura | 360/22 |
| 4,547,807 | 10/1985 | Mitani et al. | 358/213 |
| 4,563,707 | 1/1986 | Kishida | 358/294 |
| 4,566,029 | 1/1986 | Johnson | 358/50 |
| 4,675,755 | 6/1987 | Baumeister et al. | 358/909 |

Primary Examiner—James J. Groody
Assistant Examiner—Robert M. Bauer
Attorney, Agent, or Firm—Edward S. Roman

[57] ABSTRACT

Apparatus and method for electronically recording in rapid succession high resolution still images in digital format utilizing a nonvolatile electronically programmable read only memory (EPROM) module for storing the still images. Digitally formatted image data may be rapidly transferred for storage in the EPROM module by simultaneously transferring binary bit data from a plurality of latches to corresponding ones of a plurality of EPROM circuits which collectively form one of a plurality of groups of EPROM circuits which comprise the EPROM module.

16 Claims, 3 Drawing Sheets

ELECTRONIC IMAGING CAMERA UTILIZING EPROM MEMORY

BACKGROUND OF THE INVENTION

1. Field of the Invention

This invention relates generally to an apparatus and method for electronically recording still images in a digital data format and, more particularly, to an apparatus and method for electronically recording high resolution still images in a digital format in a sufficiently short period of time so as to allow a plurality of still images to be recorded in rapid succession.

2. Description of the Prior Art

Electronic imaging cameras for recording still images are well known in the art. Such cameras can record a plurality of still images on a single magnetic disk or tape for subsequent playback on any well-known cathode ray tube viewing device. Printers may also be utilized with such cameras in a well-known manner to provide a hard copy of the recorded images. Such electronic imaging cameras may utilize two-dimensional image sensing arrays such as charge-coupled devices (CCD's) which integrate incident scene light over a predetermined time to provide an electronic information signal corresponding to the scene light intensity incident to the array. Such two-dimensional image sensing arrays comprise a predetermined number of discrete image sensing elements or pixels arranged in a two-dimensional array in which each image sensing element responds to incident illumination to provide an electronic information signal corresponding to the intensity of the incident illumination.

Most recently, instead of recording electronic still images on magnetic tape or disk, it has been suggested that such still images may be recorded on nonvolatile type integrated circuit memories such as magnetic bubble devices as disclosed in U.S. Pat. No. 4,489,351, entitled "Electronic Still Camera With Individual Nonvolatile Memory Units", issued Dec. 18, 1984. One advantage to such nonvolatile semiconductor memories is that they can be readily removed from the camera housing and connected to electronic display devices or printers of the type previously discussed. Cameras of the aforementioned type, however, have been limited to recording still image defining electronic information signals in analog format. High resolution electronic still image cameras, however, demand that the image defining electronic information signals be recorded in digital format which substantially increases the volume of image defining data that must be recorded as well as the time required to transfer and record the electronic information signals for each still image.

Therefore, it is an object of this invention to provide an electronic still image camera which can record a succession of high resolution still images in digital format in rapid succession.

It is a further object of this invention to provide an electronic high resolution still image camera that can record a succession of still images in rapid succession utilizing a nonvolatile detachable EPROM memory module.

Other objects of the invention will be, in part, obvious and will, in part, appear hereinafter. The invention accordingly comprises a mechanism and system possessing the construction, combination of elements and arrangement of parts which are exemplified in the following detailed disclosure.

DESCRIPTION OF THE DRAWINGS

The novel features that are considered characteristic of the invention are set forth with particularity in the appended claims. The invention itself, however, both as to its organization and its method of operation, together with other objects and advantages thereof, will be best understood from the following description of the illustrated embodiment when read in connection with the accompanying drawings wherein:

SUMMARY OF THE INVENTION

An electronic still image camera comprises an image sensing array having a predetermined number of discrete image sensing elements each of which is responsive to incident illumination from a subject to provide an analog information signal corresponding to the intensity of illumination incident thereto. An analog-to-digital converter converts the analog electronic information signals received from the image sensing array to digital electronic information signals such that a separate and distinct digital electronic information signal comprising a plurality of binary bits corresponds to the intensity of illumination incident to each of the image sensing elements. A buffer memory thereafter operates to temporarily store the digital electronic information signals received from the analog-to-digital converter. An electronically programmable read only memory (EPROM) module comprises a plurality of discrete EPROM semiconductor circuits arranged in groups. Each of the discrete EPROM semiconductor circuits may be individually addressed and controlled to receive select binary bits of the digital electronic information signals. Means are provided for addressing and controlling the groups of discrete EPROM semiconductor circuits in ordered sequence so that the digital electronic information signals which define each still image are stored, respectively, in selected ones of the groups. The address and control means also operates to address and control each one of the discrete EPROM semiconductor circuits in the selected group to simultaneously store a different one of the binary bits of the digital electronic information signal.

DESCRIPTION OF THE PREFERRED EMBODIMENTS

Figure 1:
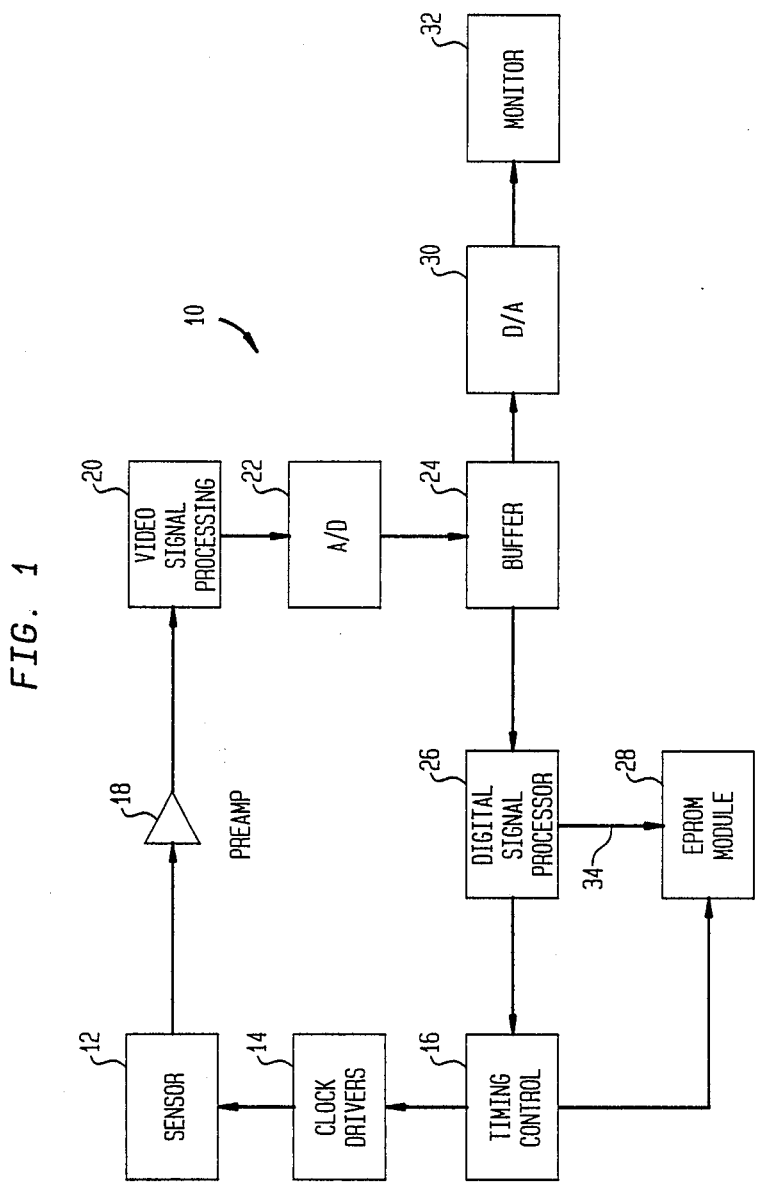
FIG. 1 is a schematic block diagram of the electronic still image camera of this invention.

Referring now to FIG. 1, there is shown at 10 a schematic block diagram for the digital electronic still image camera of this invention. The camera 10 of this invention includes an image sensing array 12 comprising a predetermined number of discrete image sensing elements or pixels preferably arranged in a two-dimensional array in which the image sensing elements respond to incident illumination to provide an electronic information signal corresponding to the intensity of the incident illumination. Such image sensing arrays are well known in the art and may comprise a charge-coupled device (CCD), a charge-injection device (CID), or any other well-known charge domain device of the line or frame transfer type. The image sensing array 12 may sense color images by filtering the illumination incident thereto so that different groups of the image sensing elements arranged in well-known patterns across the image-sensing array 12 receive different wavelengths of colored illumination. Such filter patterns may comprise color filter stripes as is well known in the art. The electronic still image camera 10 of this invention may include any well-known lens, shutter, flash and viewfinder arrangement all of which are not shown in the drawing. As will be readily understood, the still image defining electronic information signals output by the sensor 12 are in analog format with the value of each succeeding signal corresponding to the intensity of the illumination incident to the corresponding picture sensing element or pixel.

The still image defining electronic information signals output from the sensor 12 are subsequently amplified by a preamplifier 18 and thereafter processed by way of a video signal processing circuit 20 in a manner well known in the art to provide a low noise wide bandwidth signal. The still image defining analog electronic information signals from the video processing circuit 20 are subsequently directed to an analog-to-digital converter 22 for conversion to a digital format. The digitally formatted still image defining electronic information signals are thereafter temporarily stored in a buffer memory 24.

If the camera user then wishes to review the image of the scene which he has recorded in order to determine whether he would like to permanently store the image, he may then retrieve from the buffer memory 24 still image defining electronic information signals which are subsequently converted from their digital format to an analog format by a digital-to-analog converter 30. The analog formatted still image defining electronic information signals are thereafter directed to a display device 32 which may be either a CRT or liquid crystal display built into a conveniently viewable location in the camera housing so as to enable the camera user to review the recorded image of the scene.

If the camera user decides that the image he has recorded is satisfactory, he may then transfer the still image defining electronic information signals from the buffer memory 24 to a digital signal processor 26 which operates to perform a data compression algorithm to substantially reduce the number of bits in the image defining electronic information signal. The compressed digital image defining electronic information signal is thereafter output from the digital signal processor 26 by way of line 34 for permanent storage in an electronically programmable read only memory (EPROM) module 28.

A timing control circuit 16 which may comprise programmable logic arrays provides timing control signals to a clock driver circuit 14 for clocking the still image defining electronic information signals from the sensor 12 in a manner well known in the art. The timing control 16 also provides timing control signals to control and address the EPROM module 28 in the manner of this invention to be subsequently described herein.

Figure 2:
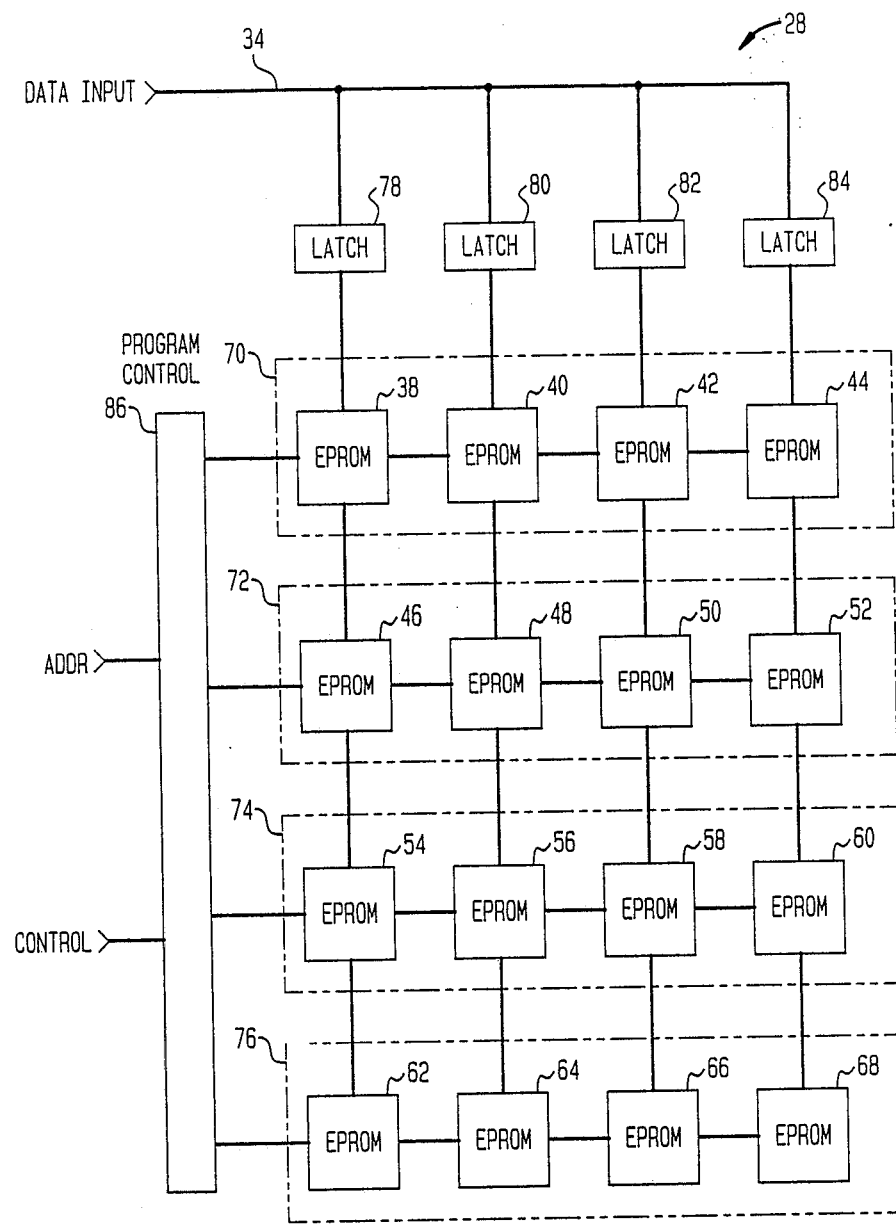
FIG. 2 is a schematic block diagram showing in substantial detail a component of the electronic still image camera of FIG. 1.

Referring now to FIG. 2, there is shown a schematic block diagram for the EPROM module 28 comprising a plurality of discrete EPROM semiconductor circuits 38-68 even numbers only. The discrete EPROM semiconductor circuits 38-68 even numbers only are divided into four groups 70-76 even numbers only as shown. Thus, each group 70-76 even numbers only comprises four discrete EPROM semiconductor circuits. Each discrete EPROM semiconductor circuit in each of the groups 70-76 even numbers only connects to a respective one of a plurality of latch circuits 78-84 even numbers only. The latch circuits 78-84 even numbers only connect, respectively, to the output line 34 from the digital signal processor 26. Address and control signals are provided from the timing control circuit 16 to a program control circuit 86 to address and control the transmission of binary bits of the image defining digital electronic information signal for storage in respective ones of the discrete EPROM semiconductor circuits 38-68 even numbers only in the manner of this invention to be subsequently described.

Operation of the digital still image camera 10 of this invention will now be described for an image sensor comprising 600K image sensing elements or pixels. It will be readily understood that the number of image sensing pixels herein described is selected only by way of example as a convenient and realistic number and in actual practice may be greater or less depending upon the picture resolution desired, as well as the cost of the camera system. As is readily apparent, the greater the number of image sensing elements, the greater the resolution that can be achieved for the recorded still image. The scene to be recorded is framed and composed in the usual manner by the camera user, and image defining scene light is admitted to the sensor 12 for a select exposure interval by way of the camera objective lens and shutter (not shown). The clock drivers 14 provide the appropriate clocking signals in a well-known manner to clock out of the image sensor 12 in an ordered sequence image defining analog electronic information signals corresponding to the scene light incident to each sensing element or pixel of the sensor 12.

The image defining analog electronic information signals, in turn, are amplified by the preamplifier 18 and subsequently processed by the video signal processing circuit 20 to provide a wide bandwidth low noise output signal to the analog-to-digital converter 22. The image defining analog electronic information signal corresponding to the illumination incident to each image sensing element of the sensor 12 is converted to an image defining digital electronic information signal comprising eight binary bits. Again, eight binary bits are selected only by way of example as defining an adequate variation in image greyscale, although more or less binary bits may be used again depending upon the image resolution desired as well as the cost of the camera system. Since the image sensor as previously described has 600K image sensing elements, the analog-to-digital converter 22 provides an output image defining digital electronic information signal comprising 4.8 million binary bits which are subsequently stored in the buffer memory 24.

As previously described, the camera user may retrieve the image defining digital electronic information signal from the buffer memory 24 by way of the digital-to-analog converter 30 to display the recorded image on the monitor 32. In this manner, the camera user may view the recorded still image to decide whether he would like to permanently store the recorded image in the EPROM module 28. In the event that the recorded still image is satisfactory, the camera user may then direct the image defining digital electronic information signal stored in the buffer memory 24 to the digital signal processor 26 for image compression.

Figure 3:
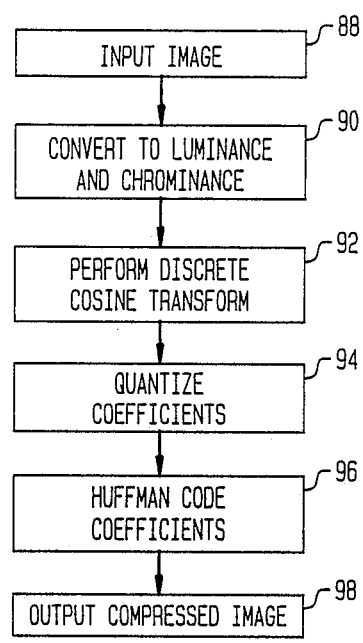
FIG. 3 is a flowchart showing the successive steps of operation of another component of the electronic still image camera of FIG. 1.

Referring now to FIG. 3, there is shown a flowchart showing the processing steps implemented by the digital signal processor 26. The image defining digital electronic information signals may correspond, respectively, to filtered red, green and blue scene illumination sensed by the image sensor 12 as a result of a red, green and blue color filter stripe pattern overlying the image sensing elements in a well-known manner as previously discussed. Thus, the image defining digital RGB electronic information signals (block 88) are converted to image defining luminance and chrominance electronic information signals as shown at block 90. The luminance and chrominance electronic information signals subsequently undergo a disrete cosine transformation (block 92). The cosine transformed electronic information signals subsequently have their coefficients quantized (block 94) and thereafter incur Huffman coding of the above coefficients (block 96). The image defining compressed digital electronic information signal output at block 98 preferably comprises one million binary bits thereby undergoing a data compression in the order of 4.8 to 1 binary bits. The data compression technique as illustrated by the flowchart of FIG. 3 is conventional and well known to the art.

The binary bits of the image defining compressed digital electronic information signals are thereafter directed in an ordered sequence by way of the line 34 to the latch circuits 78-84 even numbers only. Thus, after each of the latch circuits receives a plurality of the ordered sequence of binary bits from the line 34, the program control 86 operates to transfer the plurality of binary bits from each of the latch circuits 78-84 even numbers only to each respective connecting one of the EPROM semiconductor circuits 38-44 even numbers only of group 70. The plurality of binary bits stored and simultaneously transferred by each of the latch circuits 78-84 even numbers only is preferably eight bits or one byte. After the first four bytes of the image defining compressed digital electronic information signals are loaded in the EPROM semiconductor circuits 38-44 even numbers only, the next four succeeding bytes are directed in their ordered sequence to the latch circuits 78-84 even numbers only, respectively. The latches thereafter simultaneously load the same EPROM semiconductor circuits. The sequencing of the latch circuits and EPROM semiconductor circuits of group 70 continue in the aforementioned manner until all the bytes of the compressed digital electronic information signal which defines the still image to be recorded are stored in the group 70.

As will be readily understood, the latch circuits 78-84 even numbers only are bi-directional in order to facilitate the transmission of the binary bits of the image defining compressed digital electronic information signals both to and from the EPROM semiconductor circuits. The program control circuit 86 controls both the transmission and retrieval of image defining electronic information signals from the EPROM module 28 so that any recorded image can be subsequently retrieved for display in any well-known manner.

Each EPROM semiconductor circuit preferably can store one million binary bits thereby facilitating the storage of four still images in each of the groups 70-76 even numbers only of the EPROM semiconductor circuits. As is readily apparent, since the EPROM module 28 comprises four groups 70-76 even numbers only of EPROM semiconductor circuits there can be stored a total of sixteen still images each comprising one million binary bits of compressed digital electronic information signals.

If each still image of one million binary bits were to be stored in a single EPROM semiconductor circuit, the transfer time for the electronic information signals would be approximately eight seconds which is an inordinate and unacceptable length of time for a still image camera. However, by simultaneously loading each EPROM semiconductor circuit in a selected group by the latch circuits in the aforementioned manner there can be achieved a 4 to 1 reduction in the data transfer time thereby requiring only two seconds to permanently store each still image. Thus, the data transfer rates for a digital still image electronic camera can be made sufficiently short as to make possible the use of EPROM memory devices in place of magnetic or optical storage systems as well as other nonvolatile storage devices such as bubble memories.

Figure 4:
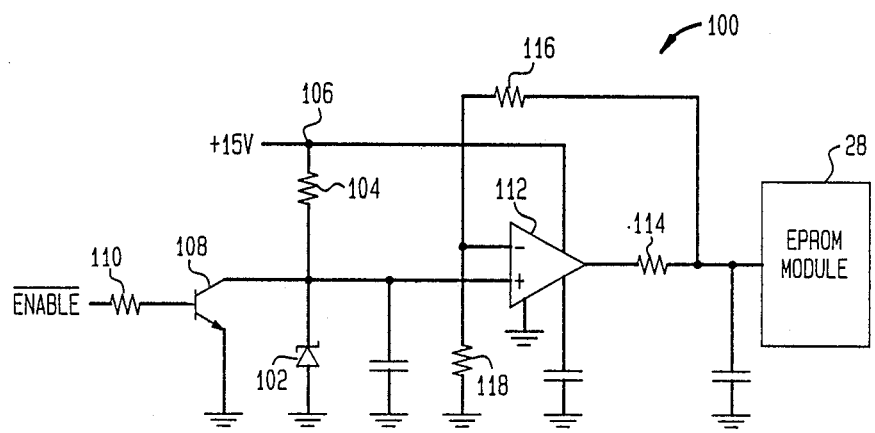
FIG. 4 is a schematic circuit diagram for a regulated voltage supply to be used with the electronic still image camera of FIG. 1.

The data transfer rates can be even further reduced by using the absolute maximum programming voltage allowable for the EPROM semiconductor circuits. Toward that end there is shown at FIG. 4 a voltage regulating circuit 100 comprising a precision reference diode 102 in series connection with a resistor 104 connecting at node 106 to a nonregulated voltage supply which may be in the order of 15 volts. The precision reference diode may be of the type manufactured by National Semiconductor having the designated part number LM129. The output from the precision reference diode 102 is directed to one input terminal of an operational amplifier 112 having a feedback resistor network comprising the resistors 116 and 118. The output of the operational amplifier 112, in turn, is directed by way of a dampening output resistor 114 to provide the maximum allowable programming voltage to the EPROM module 28. The regulated voltage supply 100, in turn, may be controlled by way of an enabling NPN transistor 108, the base terminal of which receives an enabling control voltage by way of a base resistor 110. Thus, in order to enable the regulated voltage supply 100 there is provided a low enable voltage to the base resistor 110 so as to turn off transistor 108 and open circuit the precision reference diode 102. The high accuracy regulated voltage supply of FIG. 4 can achieve a further reduction in the data transfer times required by an order of 4 to 1 thereby reducing the programming time required to store the binary bits for each still image to approximately ½ second.

The EPROM module 28 may be detachable from the camera, and since it is a nonvolatile memory the images are permanently stored without maintaining a continuous drain on power. Thus, the EPROM module 28 can be removed and connected to any electronic image printing or display device without loss of image data or battery consumption. Since EPROM's are not erasable except by ultraviolet light, it may be preferable for some cameras to use erasable EPROM memories to allow the camer user the option of recording new still images without replacing the EPROM module.

Other embodiments of the invention, including additions, subtractions, deletions and other modifications of the preferred disclosed embodiments of the invention will be obvious to those skilled in the art and are within the scope of the following claims.

What is claimed is:

1. An electronic still image camera comprising:
    an image sensing array having a predetermined number of discrete image sensing elements each of which is responsive to incident illumination from a subject to provide an analog information signal corresponding to the intensity of the illumination incident thereto;
    an analog-to-digital converter for converting the analog electronic information signals received from said image sensing array to digital electronic information signals such that a separate and distinct digital electronic information signal comprising a plurality of binary bits corresponds to the intensity of illumination incident to each of said image sensing elements;
    a buffer memory for temporarily storing the digital electronic information signals received from said analog-to-digital converter;
    an electronically programmable read only memory (EPROM) module comprising a plurality of discrete EPROM semiconductor circuits arranged so that each of said discrete EPROM semiconductor circuits may be individually addressed and controlled to receive select binary bits of the digital electronic information signals; and
    means for addressing and controlling selected groups of said discrete EPROM semiconductor circuits in an ordered sequence so that the digital electronic information signals which define each still image are stored, respectively, in selected ones of said groups, said means operating to address and control each one of said discrete EPROM semiconductor circuits in said selected group to simultaneously store a different plurality of the binary bits of the digital electronic information signal.

2. The electronic still image camera of claim 1 wherein said EPROM module comprises a plurality of latch circuits connected with respect to said buffer memory to receive therefrom in an ordered sequence the binary bits of the digital electronic information signals, said latch circuits each connecting to a different respective one of said discrete EPROM semiconductor circuits in each of said groups in said module so as to simultaneously input each discrete EPROM semiconductor circuit of said select group with a different plurality of the binary bits of the digital electronic information signals.

3. The electronic still image camera of claim 1 further comprising a regulated voltage supply for providing a regulated output supply voltage to energize said discrete EPROM semiconductor circuits at the maximum allowable programming voltage.

4. The electronic still image camera of claim 3 wherein said regulated voltage supply comprises a non-regulated voltage supply, a precision reference diode serially connected by way of a resistor to said non-regulated voltage supply for providing a precise reference voltage, and means for amplifying said precise reference voltage to provide said maximum allowable programming supply voltage.

5. The electronic still image camera of claim 1 further comprising means for imposing a select data compression algorithm to the digital electronic information signals prior to transmission to said EPROM memory.

6. The electronic still image camera of claim 5 wherein said select data compression algorithm includes a cosine transform.

7. The electronic still image camera of claim 1 further comprising a digital-to-analog converter for converting the digital electronic information signals received from said buffer memory to analog electronic information signals, and a display monitor for converting the analog electronic information signals received from said analog-to-digital converter to a visually discernible display of the still image sensed by said image sensing array.

8. The electronic still image camera of claim 1 wherein said EPROM semiconductor circuits are erasable.

9. A process for electronically sensing and storing a still image comprising the steps of:
    sensing scene light with a predetermined number of discrete image sensing elements and providing an analog information signal corresponding to the intensity of illumination incident to each of the discrete image sensing elements;
    converting the analog electronic information signals to digital electronic information signals so that a separate and distinct digital electronic information signal comprising a plurality of binary bits corresponds to the intensity of illumination incident to each of the image sensing elements;
    temporarily storing the digital electronic information signals; and
    finally storing the digital electronic information signals which define each still image in a select one of a plurality of different groups of electronically programmable read only memories (EPROM's) in a manner whereby a different plurality of the binary bits of the digital electronic information signals are simultaneously stored in respective ones of the EPROM's in the selected group.

10. The process of claim 9 further including the step of latching different binary bits of the digital electronic information signals subsequent to the temporary storage thereof in an ordered sequence and thereafter transferring the latched different binary bits of the digital electronic information signals simultaneously to the EPROM's of a select group respectively.

11. The process of claim 9 further comprising the step of energizing the EPROM's with a supply voltage regulated at the maximum allowable programming voltage.

12. The process of claim 11 further comprising the steps of regulating the supply voltage to the EPROM's by providing a precision reference voltage and subsequently amplifying the precision reference voltage.

13. The process of claim 9 further comprising the step of compressing the digital electronic information signals prior to storage in the EPROM's.

14. The process of claim 13 wherein said compressing step includes a cosine transformation.

15. The process of claim 9 further comprising the steps of converting the digital electronic information signals back to analog electronic information signals subsequent to said temporary storage and subsequently converting the analog electronic information signals to a visually discernible display.

16. The process of claim 9 further including the step of erasing the digital electronic information signals stored in said EPROM's.

* * * * *